(12) United States Patent
Han

(10) Patent No.: US 7,446,679 B1
(45) Date of Patent: Nov. 4, 2008

(54) COMPRESSION AND DECOMPRESSION OF CONFIGURATION DATA FOR PROGRAMMABLE LOGIC DEVICES

(75) Inventor: Wei Han, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/779,246

(22) Filed: Jul. 17, 2007

(51) Int. Cl.
H03M 7/38 (2006.01)
H03M 7/34 (2006.01)

(52) U.S. Cl. .............................. 341/51; 341/65; 341/67
(58) Field of Classification Search .................. 341/50, 341/51, 58, 59, 65, 67, 87; 707/100, 101
See application file for complete search history.

(56) References Cited

U.S. PATENT DOCUMENTS

| | | | |
|---|---|---|---|
| 5,608,396 A * | 3/1997 | Cheng et al. | 341/50 |
| 5,872,529 A | 2/1999 | Mejia | |
| 6,127,953 A * | 10/2000 | Manzardo | 341/87 |
| 6,744,388 B1 | 6/2004 | Khu | |
| 7,109,895 B1 | 9/2006 | Langhammer | |

OTHER PUBLICATIONS

U.S. Appl. No. 11/054,855, Ma et al.
U.S. Appl. No. 11/054,750, Wicker.
U.S. Appl. No. 11/533,188, Chen.
Run-length encoding, http://en.wikipedia.org/wiki/Run-length_encoding, 3 pages, Jun. 30, 2007.
LZ77 and LZ78, http://en.wikipedia.org/wiki/LZ77, 3 pages, Jun. 30, 2007.

* cited by examiner

*Primary Examiner*—Peguy JeanPierre
(74) *Attorney, Agent, or Firm*—MacPherson Kwok Chen & Heid LLP; Brent A. Folsom

(57) ABSTRACT

Various approaches are disclosed to provide improved compression and decompression of configuration data for use with programmable logic devices (PLDs). Uncompressed configuration data may comprise a plurality of rows. In accordance with one embodiment, a method of converting the uncompressed configuration data into compressed configuration data includes encoding a row of configuration data comprising only bulk erase bytes into a first bit pattern within a fixed length header. The method also includes encoding a number of continuous bulk erase bytes of configuration data in a row that includes more than bulk erase bytes into a second bit pattern within the fixed length header. The method further includes encoding at least a portion of a row of configuration data according to a Lempel-Ziv (LZ) compression process into a third bit pattern within the fixed length header.

20 Claims, 5 Drawing Sheets

COMPRESSION AND DECOMPRESSION OF CONFIGURATION DATA FOR PROGRAMMABLE LOGIC DEVICES

TECHNICAL FIELD

The present invention relates generally to data compression and, more particularly, to compression and decompression of configuration data for programmable logic devices.

BACKGROUND

Programmable logic devices (PLDs), such as field programmable gate arrays (FPGAs) or complex programmable logic devices (CPLDs), may be programmed with configuration data to provide various user-defined features. For example, desired functionality may be achieved by programming a configuration memory of a PLD with an appropriate configuration data bitstream.

Unfortunately, the transfer of such configuration bitstreams to PLDs or external memory devices is often cumbersome. In particular, the loading of large uncompressed configuration data bitstreams can result in undesirable delays that are unacceptable in various applications. This can be particularly problematic for implementations where uncompressed configuration data bitstreams are loaded into a PLD from an external device each time the PLD is booted.

However, existing data compression methods are generally not well adapted for use with the particular data formats associated with configuration data bitstreams. For example, in one approach, bulk erase bytes (i.e., bytes comprised of eight erase bits) appearing within an 8 byte sequence of configuration data may be represented by an 8 bit header identifying the location of the bulk erase bytes within the sequence. In another approach, Huffman coding techniques may be used to encode bulk erase bytes and repetitive bytes appearing within a sequence or row of configuration data.

Unfortunately, when used alone, these approaches may not provide efficient compression of configuration data unless large numbers of bulk erase bytes or individual repetitive bytes are present. In particular, they do not provide a sufficiently generic approach to compression that may be used with a variety of different configuration data bitstreams. Accordingly, there is a need for an improved approach to the compression of configuration data bitstreams for use with PLDs.

SUMMARY

In accordance with one embodiment of the present invention, a method of converting uncompressed configuration data into compressed configuration data, wherein the uncompressed configuration data comprises a plurality of rows, includes encoding a row of configuration data comprising only bulk erase bytes into a first bit pattern within a fixed length header; encoding a number of continuous bulk erase bytes of configuration data in a row that includes more than bulk erase bytes into a second bit pattern within the fixed length header; and encoding at least a portion of a row of configuration data according to a Lempel-Ziv (LZ) compression process into a third bit pattern within the fixed length header.

In accordance with another embodiment of the present invention, a method of converting uncompressed configuration data into compressed configuration data, wherein the uncompressed configuration data comprises a plurality of rows, the method includes encoding a row of configuration data comprising only bulk erase bytes into a first bit pattern within a fixed length header followed by a corresponding bit code indicating the contents of the row; encoding a row of configuration data matching a previous row into the first bit pattern within the fixed length header followed by an address of the previous row; and encoding a number of continuous bulk erase bytes of configuration data in a row that includes more than bulk erase bytes into a second bit pattern within the fixed length header, wherein the range of possible addresses of a previous row does not include the corresponding bit code.

In accordance with another embodiment of the present invention, a programmable logic device (PLD) includes a plurality of programmable logic blocks; a configuration memory adapted to store uncompressed configuration data to determine user-defined functionality of the programmable logic blocks; and a decompression engine adapted to convert compressed configuration data into the uncompressed configuration data for storage in the configuration memory, the decompression engine includes an input port adapted to receive the compressed configuration data, a control block adapted to provide a first control signal and a second control signal, a plurality of header registers adapted to store a fixed length header encoded in the compressed configuration data, a plurality of sliding window registers adapted to store a plurality of data bytes in a plurality of slots, a first multiplexer adapted to pass a byte from a selected one of the slots of the sliding window registers in response to the fixed length header stored in the header registers, a second multiplexer adapted to selectively pass the byte passed by the first multiplexer or pass a byte received from the input port in response to the first control signal, and a third multiplexer adapted to selectively pass the byte passed by the second multiplexer or pass a bulk erase byte in response to the second control signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. An exemplary implementation of a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, with various types of data and PLD implementations.

Figure 1:
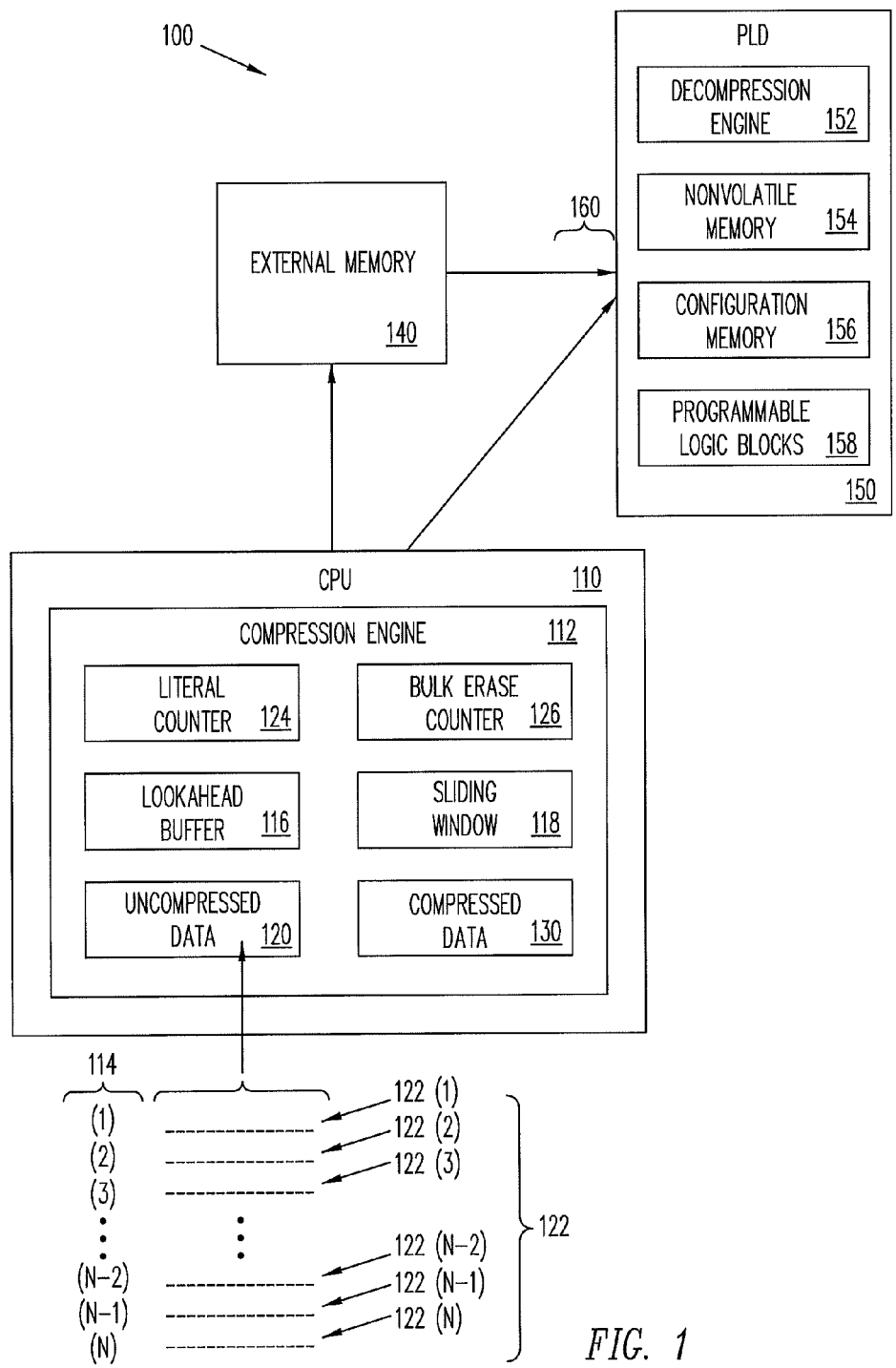
FIG. 1 illustrates a system for compressing and decompressing configuration data in accordance with an embodiment of the invention.

FIG. 1 illustrates a system 100 for compressing and decompressing configuration data in accordance with an embodiment of the invention. As shown, system 100 includes a computing device 110 (labeled "CPU"), an external memory 140, and a programmable logic device (PLD) 150. It should be understood that the number and placement of the various elements of computing device 110, external memory 140, and PLD 150 in FIG. 1 is not limiting and may depend upon the desired application. Furthermore, it should be understood that the elements are illustrated in block form for clarity.

As further described herein, computing device 110 may be operated to perform various data compression methods on configuration data (e.g., a configuration data bitstream) that is used to configure logic blocks of PLD 150. Computing device 110 may provide the compressed configuration data to external memory 140 and/or PLD 150 for storage. PLD 150 may be implemented to decompress the configuration data to recover a configuration data bitstream for use in configuring logic blocks of PLD 150. Advantageously, the transfer of compressed configuration data between computing device 110, external memory 140, and/or PLD 150 can reduce delays associated with such transfers using uncompressed configuration data.

As shown, PLD 150 (e.g., an FPGA) includes data ports 160 that may be used by PLD 150 to communicate with computing device 110 and/or external memory 140. For example, data ports 160 may be used to receive configuration data and/or commands from computing device 110 and/or external memory 140. In one embodiment, data ports 160 may be implemented as one or more serial peripheral interface (SPI) ports. As understood by those skilled in the art, SPI is a serial interface standard established by Motorola Corporation of Schaumburg, Ill. In another embodiment, data ports 160 may be implemented as one or more joint test action group (JTAG) ports employing standards such as Institute of Electrical and Electronics Engineers (IEEE) 1149.1 and/or IEEE 1532 standards.

PLD 150 also includes programmable logic blocks 158 (e.g., also referred to in the art as configurable logic blocks or logic array blocks) to provide logic functionality for PLD 150, such as, for example, LUT-based logic typically associated with FPGAs. The configuration of programmable logic blocks 158 is determined by the configuration data stored in configuration memory 156 (e.g., block SRAM).

PLD 150 further includes a decompression engine 152 which may be implemented, for example, by appropriate circuitry of PLD 150 as further described herein. Decompression engine 152 may operate to decompress compressed configuration data 130 to obtain uncompressed configuration data 120 received by PLD 150 from external memory 140 and/or computing device 110. The uncompressed configuration data 120 may then be loaded into configuration memory 156 of PLD 150.

PLD 150 may optionally include reprogrammable non-volatile memory 154 (e.g., blocks of EEPROM or flash memory). In one embodiment, non-volatile memory 154 may be used to store uncompressed configuration data 120 within PLD 150 for transfer to configuration memory 156 of PLD 150 upon power up or during reconfiguration of PLD 150. In another embodiment, non-volatile memory 154 may be used to store compressed configuration data 130 which may be decompressed by decompression engine 152 to obtain uncompressed configuration data 120 for loading into configuration memory 156.

External memory 140 may be implemented, for example, as a non-volatile memory (e.g., an SPI serial flash memory) which may be used to store uncompressed configuration data 120 and/or compressed configuration data 130 to be loaded into PLD 150 through data ports 160.

Computing device 110 includes a compression engine 112. In one embodiment, compression engine 112 may be implemented by one or more processors of computing device 110 configured with appropriate software (e.g., a computer program for execution by a computer), stored on a computer-readable medium, configured to instruct the one or more processors to perform one or more of the operations described herein to provide a software-based compression engine. In another embodiment, compression engine 112 may be implemented by dedicated hardware of computing device 110. In yet another embodiment, compression engine 112 may be implemented by a combination of software and hardware.

Compression engine 112 may be implemented to operate on uncompressed configuration data 120 to convert such data into compressed configuration data 130 which may be provided to external memory 140 and/or PLD 150. As shown in FIG. 1, uncompressed configuration data 120 may be implemented as a plurality of data rows 122 (also referred to as frames), each of which is associated with a corresponding row address 114. Row addresses 114 may be implemented using any desired bit length such as, for example, 16 bits. In one embodiment, each of rows 122 may include configuration data associated with a corresponding row of configuration memory 156 (e.g., a row of SRAM cells) of PLD 150.

Compression engine 112 may be implemented to generate compressed configuration data 130 from uncompressed configuration data 120 using various data compression methods, or combinations thereof. To support such data compression, compression engine 112 includes a lookahead buffer 116 and a sliding window 118 as such terms are understood by those skilled in the art. Lookahead buffer 116 and sliding window 118 may be implemented with various sizes as may be desired in particular applications such as, for example, 112 bits and 112 bits, 248 bits and 248 bits, or 112 bits and 56 bits, respectively. As shown, compression engine 112 also includes a literal counter 124 and a bulk erase counter 126 which may be used as further described herein.

In one embodiment, compression engine 112 may be implemented to perform a Lempel-Ziv (LZ) compression process (e.g., LZ77 encoding) on uncompressed configuration data 120 to reduce redundancies in compressed configuration data 130 within a fixed size dynamic window (e.g., 128 bits or 256 bits). In this regard, compression engine 112 may be configured to encode configuration data 120 using a fixed length header (for example, an 8-bit header) to store an index-length pair. Compression engine 112 may sequentially pass uncompressed configuration data 120 into lookahead buffer 116 and compare the contents of lookahead buffer 116 with sliding window 118 which includes portions of compressed configuration data 130 (e.g., portions of uncompressed configuration data 120 following compression processing). Compression engine 112 searches for the longest match between lookahead buffer 116 and sliding window 118 and encodes a bit pattern into a fixed length header corresponding to an index-length pair identifying the match in sliding window 118. In various embodiments, the searching of lookahead buffer 116 and sliding window 118 may be performed on a per-byte or a per-half-byte basis, and may be performed beginning with the most or least significant bit of lookahead buffer 116 and/or sliding window 118.

If a match between lookahead buffer 116 and sliding window 118 is found, an index-length pair representing the matching byte by a bit pattern of a fixed length header may be created and fed into sliding window 118. If no match is found, the first byte from lookahead buffer 116 may be treated as literal byte and fed into sliding window 118. Literal counter 124 keeps track of the number of sequential literal bytes found and encodes the literal bytes based on any desired coding scheme, such as the various coding schemes described herein.

In another embodiment, compression engine 112 may be implemented to perform run length encoding (RLE) of bulk erase bytes of configuration data 120. In this regard, it will be appreciated that individual rows 122 of configuration data 120 may include large numbers of sequential bulk erase bytes. Accordingly, such bytes may be efficiently represented using various RLE encoding schemes as described herein.

In another embodiment, compression engine 112 may be implemented to perform bulk erase row encoding. In this case, compression engine 112 may check an entire row 122 of uncompressed configuration data 120 for bulk erase bytes. If the entire row 122 comprises bulk erase bytes, then compression engine 112 may represent the row 122 in compressed form with a bit pattern within a fixed length header (e.g., a single 8 bit header representing a bulk erase row) and a corresponding bit code (e.g., a 16 bit code representing the particular address 114 of the row 122 within uncompressed configuration data 120).

In another embodiment, compression engine 112 may be implemented to perform repetitive row encoding (also referred to as row LZ encoding). In this case, compression engine 112 may compare a current row of uncompressed configuration data 120 (for example, row 122(n) illustrated in FIG. 1) to previously processed rows of uncompressed configuration data 120 (for example, rows 122(1) through 122(n−1) illustrated in FIG. 1). If the contents of the current row matches one of the previously processed rows, then the current row may be coded with a bit pattern within a fixed length header (e.g., a single 8 bit header representing a row LZ encoded row) followed by an address 114 of the matching previously processed row (e.g., a 16 bit code used to represent the address 114).

Advantageously, during decompression of compressed configuration data 130, rows of uncompressed configuration data 120 decompressed from compressed configuration data 130 may be stored in configuration memory 156 (e.g., in SRAM cells) on a row-by-row basis. As a result, previously decompressed rows referenced by compressed configuration data 130 may be conveniently retrieved from configuration memory 156 by decompression engine 152.

Figure 2:
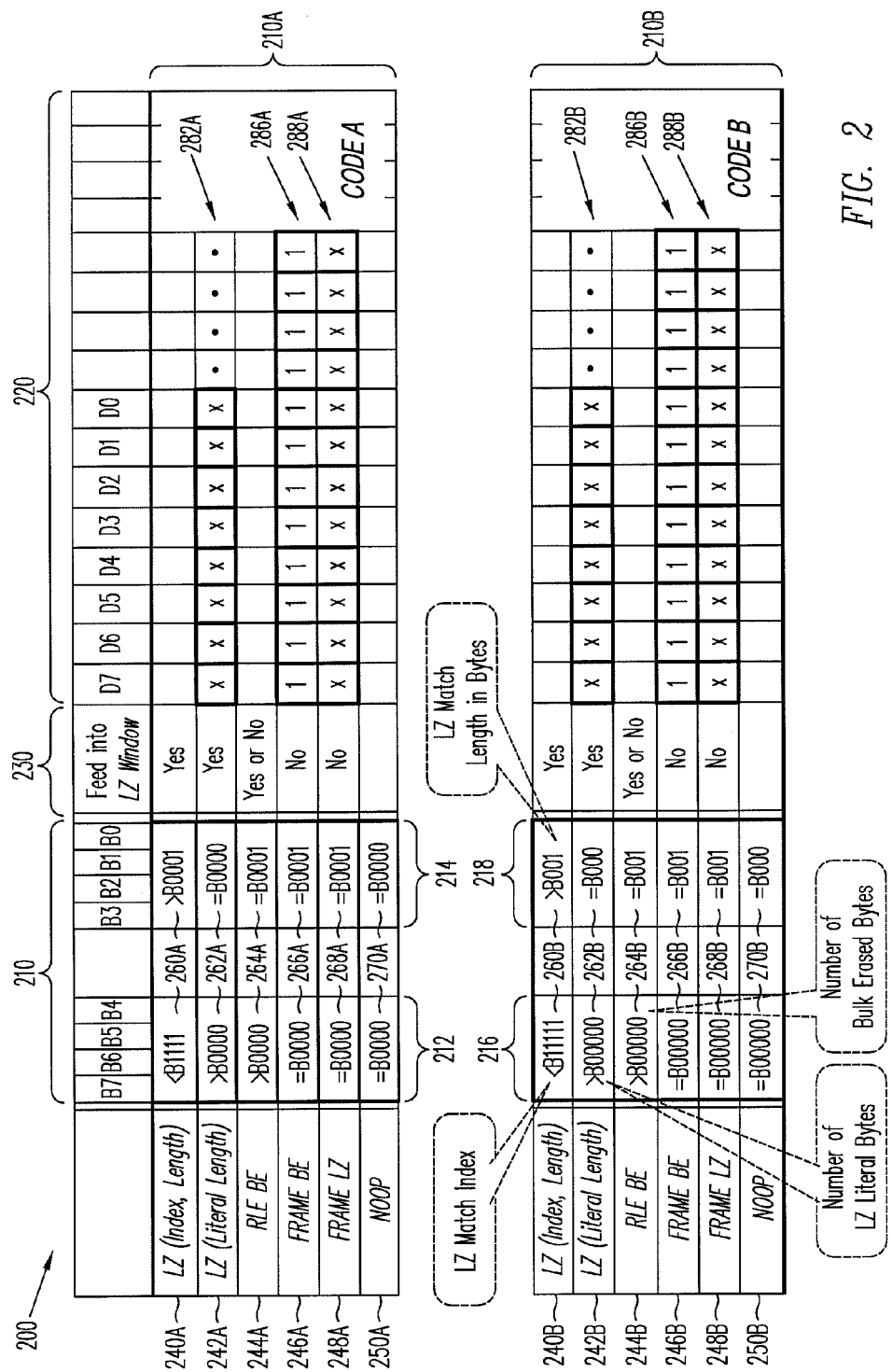
FIG. 2 illustrates a table identifying various compression coding schemes in accordance with an embodiment of the invention.

FIG. 2 illustrates a table 200 identifying various compression coding schemes 210A (labeled CODE A) and 210B (labeled CODE B) in accordance with an embodiment of the invention. Column 210 of table 200 identifies a plurality of 8 bit fixed length headers 260A-270A and 260B-270B that may be used to encode various aspects of configuration data 120. Column 220 identifies a plurality of bit codes 282A-B, 286A-B, and 288A-B that are associated with headers 262A-B, 266A-B, and 268A-B, respectively. Column 230 identifies whether individual headers and additional bit codes of columns 210 and 220, respectively, are fed into sliding window 118 during compression processing as described herein.

Turning now to the particulars of coding scheme 210A, line 240A identifies a header 260A that may be implemented with various bit patterns to encode a four bit index value in a range from 0000 to 1110 (subcolumn 212), and a four bit length value in a range from 0010 to 1111 (subcolumn 214). The index and length encoded into header 260A provide an index-length pair identifying data of a specified length and at a specified index of sliding window 118 that matches a portion of uncompressed configuration data 120 in lookahead buffer 116.

Line 242A identifies a header 262A that may be implemented with various bit patterns to encode a four bit literal length value in a range from 0001 to 1111 (subcolumn 212), and a four bit code 0000 (subcolumn 214). Header 262A is also associated with bit code 282A corresponding to a string of literals. In this regard, the number of literal bytes included in bit code 282A is specified by the literal length value of subcolumn 212.

Line 244A identifies a header 264A that may be implemented with various bit patterns to encode a four bit bulk erase byte length value in a range from 0001 to 1111 (subcolumn 212), and a four bit code 0001 (subcolumn 214). In this regard, header 264A may be used to encode a number of continuous bulk erase bytes identified by the bulk erase byte length value of header 264A in subcolumn 212.

Line 246A identifies a header 266A that may be implemented with a bit pattern (e.g., an eight bit code 00000001 across subcolumns 212 and 214) to encode an entire row 122 comprising only bulk erase bytes. Header 266A is associated with bit code 286A (1111111111111111) that indicates the contents of the row as bulk erase bytes.

Line 248A identifies a header 268A that may be implemented with a bit pattern (e.g., 00000001 across subcolumns 212 and 214). Header 268A is associated with bit code 288A that may be used to encode an address 114 of one of rows 122 of configuration data 120. In the embodiment shown in FIG. 2, bit code 288A may be used to encode an address 114 in the range of 0000000000000000 to 1111111111111110. Taken together, header 268A and bit code 288A may be used to encode a current row that matches a previously processed row of uncompressed configuration data 120.

Line 250A identifies a header 270A that may be implemented with a bit pattern (e.g., an eight bit code 00000000) to encode a non-operation byte as part of compressed configuration data 130. In this regard, header 270A may be used to facilitate usage of compressed configuration data 130 by Advanced Encryption Standard (AES) encryption techniques where dummy bytes may be used to permit the total length of compressed configuration data 130 to be easily divisible by 128.

Turning now to the particulars of coding scheme 210B, it will be appreciated from the discussion above that lines 240B-250B are implemented in a similar fashion to lines 240A-250A of coding scheme 210A, but with different codes and ranges provided for headers 260B-270B as indicated by subcolumns 216 and 218.

The following Table 1 identifies various possible implementations for lookahead buffer 116 and sliding window 118 when performing LZ compression using coding scheme 210A or 210B:

TABLE 1

| Unit | | Sliding Window | Lookahead Buffer | Coding Scheme | Index (X), Length (Y) Sample Header | Searching |
|------|------|---------|-----------|---------|--------------------|---------|
| Size | Bit  | 120     | 120       | 210A    | XXXX, YYYY         | By byte |
|      | Byte | 15      | 15        |         |                    |         |

TABLE 1-continued

| | Unit | Sliding Window | Lookahead Buffer | Coding Scheme | Index (X), Length (Y) Sample Header | Searching |
|---|---|---|---|---|---|---|
| Size | Bit | 248 | 56 | 210B | XXXXX, YYY | By byte |
| | Byte | 31 | 7 | | | |
| Size | Bit | 120 | 56 | 210B | XXXX, YYYY | By 1/2 byte |
| | Byte | 15 | 7 | | | |

Figure 3:
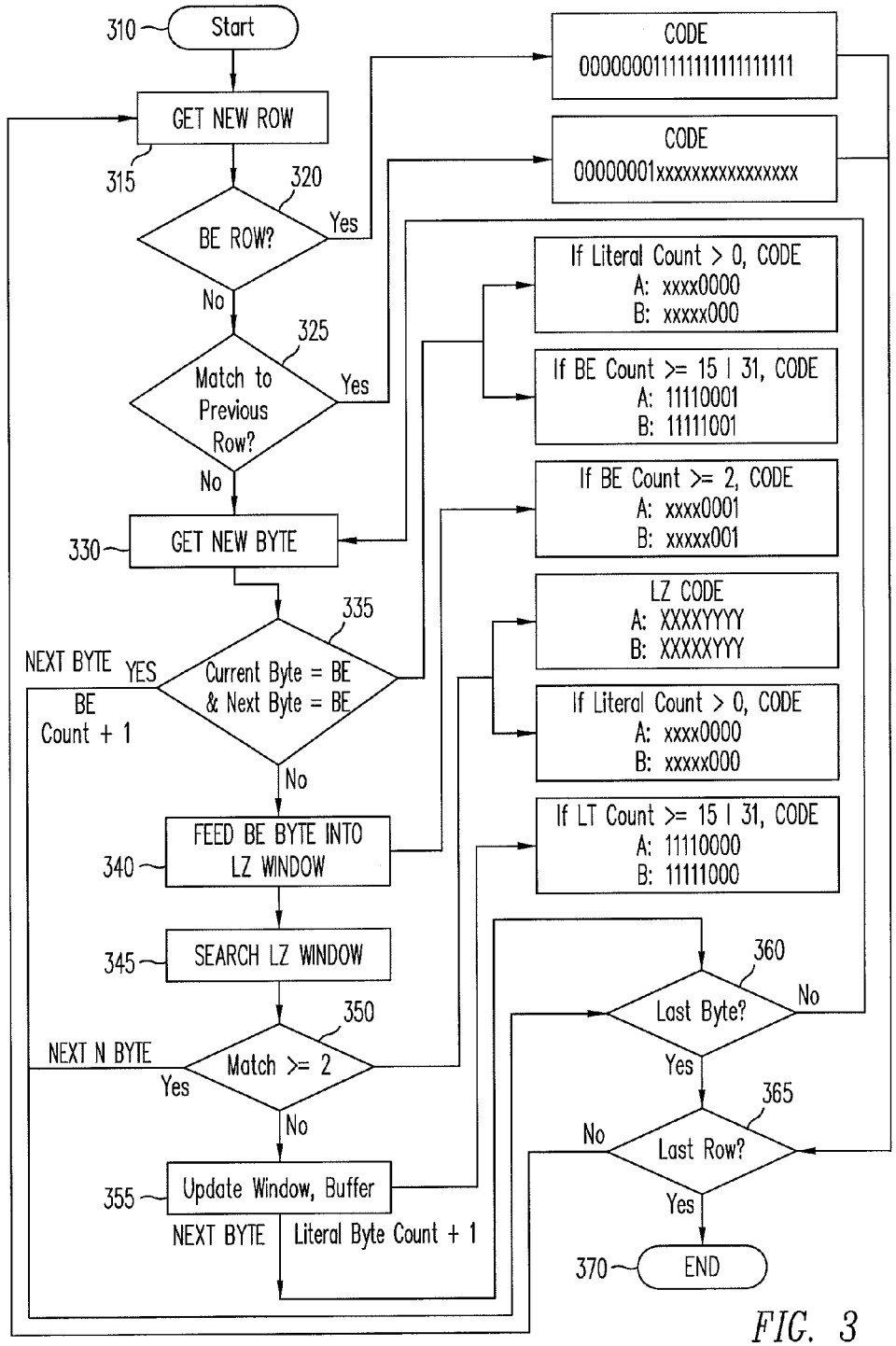
FIG. 3 illustrates an approach for processing uncompressed data to provide compressed data in accordance with an embodiment of the invention.

FIG. 3 illustrates an approach for processing uncompressed configuration data 120 to provide compressed configuration data 130 in accordance with an embodiment of the invention. It will be appreciated that the various steps of FIG. 3 may be performed by compression engine 112.

When the process of FIG. 3 begins (step 310), compression engine 112 sets literal counter 124 and bulk erase counter 126 to zero. Then, in step 315, compression engine selects a row 122 of uncompressed configuration data 120. For example, during a first iteration of step 315, compression engine may select row 122(1).

In step 320, compression engine 112 determines whether the selected row 122 includes only bulk erase bytes. If so, compression engine 112 encodes the selected row 122 using header 266A and bit code 286A (if coding scheme 210A is used) or header 266B and bit code 286B (if coding scheme 210B is used), and proceeds to step 365. Otherwise, the process continues to step 325.

In step 325, compression engine 112 determines whether the selected row 122 matches another row 122 previously processed by compression engine 112. If so, compression engine 112 encodes the selected row 122 using header 268A and bit code 288A (if coding scheme 210A is used) or header 268B and bit code 288B (if coding scheme 210B is used), and proceeds to step 365. Otherwise, the process continues to step 330.

In step 330, compression engine 112 selects a byte of the selected row 122. For example, during a first iteration of step 330 for the selected row 122, compression engine may select the first byte of the selected row 122. In subsequent iterations, other bytes of the selected row 122 may be selected.

In step 335, compression engine 112 compares the byte selected in step 330 with the next byte of the selected row 122. If both bytes are bulk erase bytes, then compression engine increments bulk erase counter 126 and proceeds to step 360. Also in step 335, if literal counter 124 is greater than zero, then compression engine 112 encodes header 262A and passes bit code 282A (if coding scheme 210A is used) or encodes header 262B and passes bit code 282B (if coding scheme 210B is used) to identify and pass the continuous literal bytes currently counted in the selected row 122 of uncompressed configuration data 120, and proceeds to step 340.

Further in step 335, if bulk erase counter 126 is greater than or equal to 15 (if coding scheme 210A is used) or 31 (if coding scheme 210B is used), then compression engine 112 encodes header 264A (if coding scheme 210A is used) or header 264B (if coding scheme 210B is used) to identify 15 or 31 continuous bulk erase bytes, and proceeds to step 340.

In step 340, if bulk erase counter 126 is greater than or equal to 2, then compression engine 112 encodes header 264A (if coding scheme 210A is used) or header 264B (if coding scheme 210B is used) to identify the number of continuous bulk erase bytes, and proceeds to step 345. Optionally in step 340, any of headers 264A or 264B encoded in previous step 335 or in step 340 may be fed into sliding window 118 for further processing using LZ compression.

In step 345, compression engine 112 compares the portions of uncompressed configuration data 120 in lookahead buffer 116 with the portions of compressed data in sliding window 118. If more than two continuous matching bytes are found, then compression engine 112 encodes the match using header 260A (if coding scheme 210A is used) or header 260B (if coding scheme 210B is used), and proceeds to step 360.

If no matches greater than 1 byte are found in step 345, and if literal counter 124 is greater than zero, then compression engine 112 encodes header 262A and passes bit code 282A (if coding scheme 210A is used) or encodes header 262B and passes bit code 282B (if coding scheme 210B is used) to identify and pass the continuous literal bytes currently counted in the selected row 122 of uncompressed configuration data 120, and proceeds to step 355.

In step 355, compression engine 112 updates lookahead buffer 116 and sliding window 118, and increments literal counter 124. Further in step 355, if literal counter 124 is greater than or equal to 15 (if coding scheme 210A is used) or 31 (if coding scheme 210B is used), then compression engine 112 encodes header 262A and passes bit code 282A (if coding scheme 210A is used) or encodes header 262B and passes bit code 282B (if coding scheme 210B is used) to identify and pass 15 or 31 continuous literal bytes, and proceeds to step 360.

In step 360, if additional bytes of the currently selected row 122 remain to be processed, then the process returns to step 330. Otherwise, the process continues to step 365.

In step 365, if additional rows 122 of uncompressed configuration data 120 remain to be processed, then the process returns to step 315. Otherwise, the process continues to step 370 where it ends.

Figure 4:
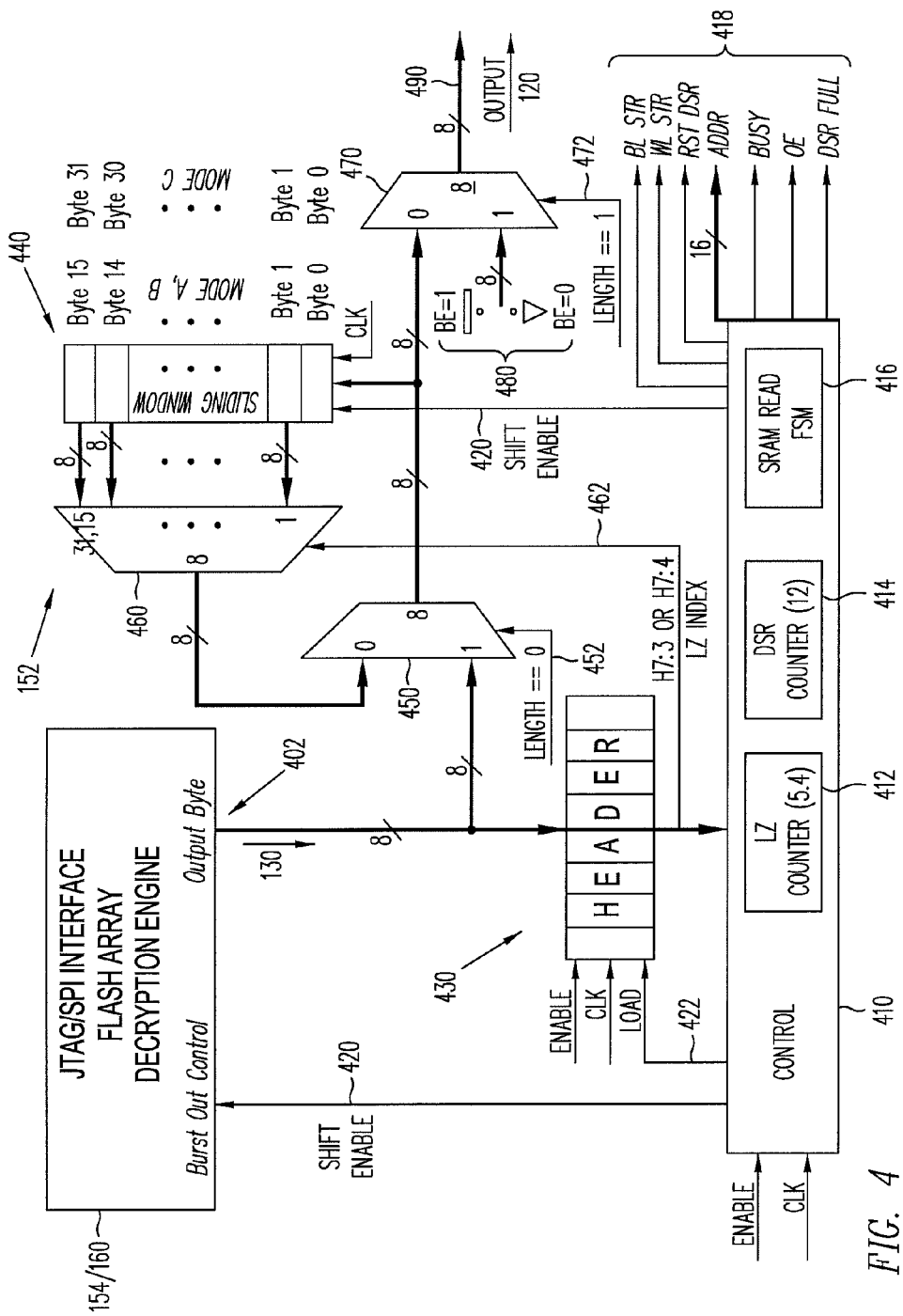
FIGS. 4-5 illustrate decompression engines in accordance with embodiments of the invention.

FIG. 4 illustrates decompression engine 152 in accordance with an embodiment of the invention. As shown in FIG. 4, decompression engine 152 includes a control block 410, a plurality of header registers 430, a plurality of sliding window registers 440, a plurality of multiplexers 450, 460, and 470, a hard coded bulk erase byte 480, and an output port 490.

Control block 410 manages the operation of the various components of decompression engine 152 to facilitate the conversion of compressed configuration data 130 into uncompressed configuration data 120. In this regard, control block 410 provides various control signals 420 and 422 to control the loading of compressed configuration data 130 from nonvolatile memory 154 or from one or more of data ports 160 (e.g., for receiving compressed configuration data 130 from computing device 110 or external memory 140) in 8 bit (1 byte) increments. Control block 410 further provides control signals 452 and 472 to select inputs of multiplexers 450 and 470, respectively.

Individual bytes of compressed configuration data 130 may be received by an input port 402 of decompression engine 152, loaded into header registers 430, and provided to multiplexer 450. As shown, the contents of header registers 430 are also provided to control block 410.

Control block 410 includes an LZ counter 412, DSR counter 414, and an SRAM read finite state machine (FSM) 416. LZ counter 412 maintains a byte count associated with each header 260A-270A and 260B-270B received at input port 402. In this regard, as previously discussed with regard to FIG. 2, each of headers 260A-270A and 260B-270B may be associated with a particular number of bytes. For example, headers 260A-B identify a number of matching bytes between lookahead buffer 116 and sliding window 118; headers 262A-B identify a number of literal bytes included in bit codes 282A-B; headers 264A-B identify a number of continuous bulk erase bytes; headers 266A-B and 268A-B identify an entire row bytes corresponding to bulk erase bytes (if bit codes 286A-B are also provided) or a previously processed row (if bit codes 288A-B are also provided); and headers 270A-B identify a non-operation byte.

Accordingly, when one of headers 260A-270A or 260B-270B is passed from header registers 430 to control block 410, LZ counter 412 will be set to the corresponding number of bytes associated with the header, and decrement by one with each byte of uncompressed configuration data 120 passed by output port 490. When LZ counter 412 reaches zero, control block 410 will expect the next byte received at input port 402 to correspond to a new header. Accordingly, control block 410 may cause the next byte to be loaded into header registers 430 using control signal 422.

DSR counter 414 counts the number of bytes passed by output port 490 as uncompressed configuration data 120. When the number of bytes reaches the size of a dynamic shift register (DSR) used by PLD 150 to load a row of uncompressed configuration data 120 into a row of configuration memory 156, control block 410 may signal appropriate circuitry of PLD 150 to load the contents of the DSR into configuration memory 156, and DSR counter 414 may be reset.

SRAM read finite state machine (FSM) 416 provides a plurality of control signals 418 for controlling the loading of uncompressed configuration data 120 from one row of configuration memory 156 to another row of configuration memory 156. In this regard, if one of headers 248A-B is received by control block 410 from header registers 430, SRAM FSM 416 can signal configuration memory 156 to load the contents of a previously loaded row of configuration memory 156 (e.g., identified by bit codes 288A or 288B following header 248A or 248B) into a current row of configuration memory 156 to facilitate row LZ encoding as previously described.

In response to control signal 452, multiplexer 450 passes either the current byte received at input port 402 or a byte from a selected input of multiplexer 460. If control block 410 determines that header 262A or 262B has been received, then control signal 452 will select the lower input of multiplexer 450 to pass the literal bytes received through input port 402 that are associated with the current header 262A or 262B. Otherwise, control signal 452 will select the upper input of multiplexer 450 to pass the selected byte from sliding window registers 440 received from multiplexer 460.

Bytes passed from multiplexer 450 are shifted into individual slots of sliding window registers 440. For example, the bytes stored by sliding window registers 440 may be shifted by one slot, and a newly passed byte may be fed into the lowermost slot (labeled Byte 0). As new bytes are passed in to sliding window registers 440, the bytes will be shifted from slot to slot of sliding window registers 440 until they reach to uppermost lost (labeled Byte 15 or Byte 31, depending on the number of sliding window registers 440 provided in various illustrated modes A, B, and C). As shown, each slot of sliding window registers 440 may be selectively passed by multiplexer 460 in response to control signal 462 which corresponds to the index of header 260A or 260B currently stored in header registers 430, depending on whether coding scheme 210A or 210B is used.

Multiplexer 470 receives bytes passed from multiplexer 450 and hard coded bulk erase byte 480. In response to control signal 472, multiplexer 470 passes either the byte received from multiplexer 450 or hard coded bulk erase byte 480. If control block 410 determines that header 264A or 264B has been received, then control signal 472 will select the lower input of multiplexer 470 to pass hard coded bulk erase byte 480. Otherwise, control signal 472 will select the upper input of multiplexer 470 to pass the byte received from multiplexer 450.

In one embodiment, decompression engine 152 may process compressed configuration data 130 at a rate of approximately one byte per clock. Decompression engine 152 may be implemented in PLD 150 with minimal additional circuitry over existing PLD designs. For example, in one embodiment, the various registers of decompression engine 152 may be implemented by approximately 64 to 128 registers. In one embodiment where PLD 150 is implemented using a 90 nm manufacturing process, the additional die size cost of decompression engine 152 is approximately 2K um2, which may be approximately 0.0028% of a total die size of 111.92 Kmil. The die size cost of decompression engine 152 may be even less for an embodiment where PLD 150 is implemented with a 65 nm manufacturing process.

Figure 5:
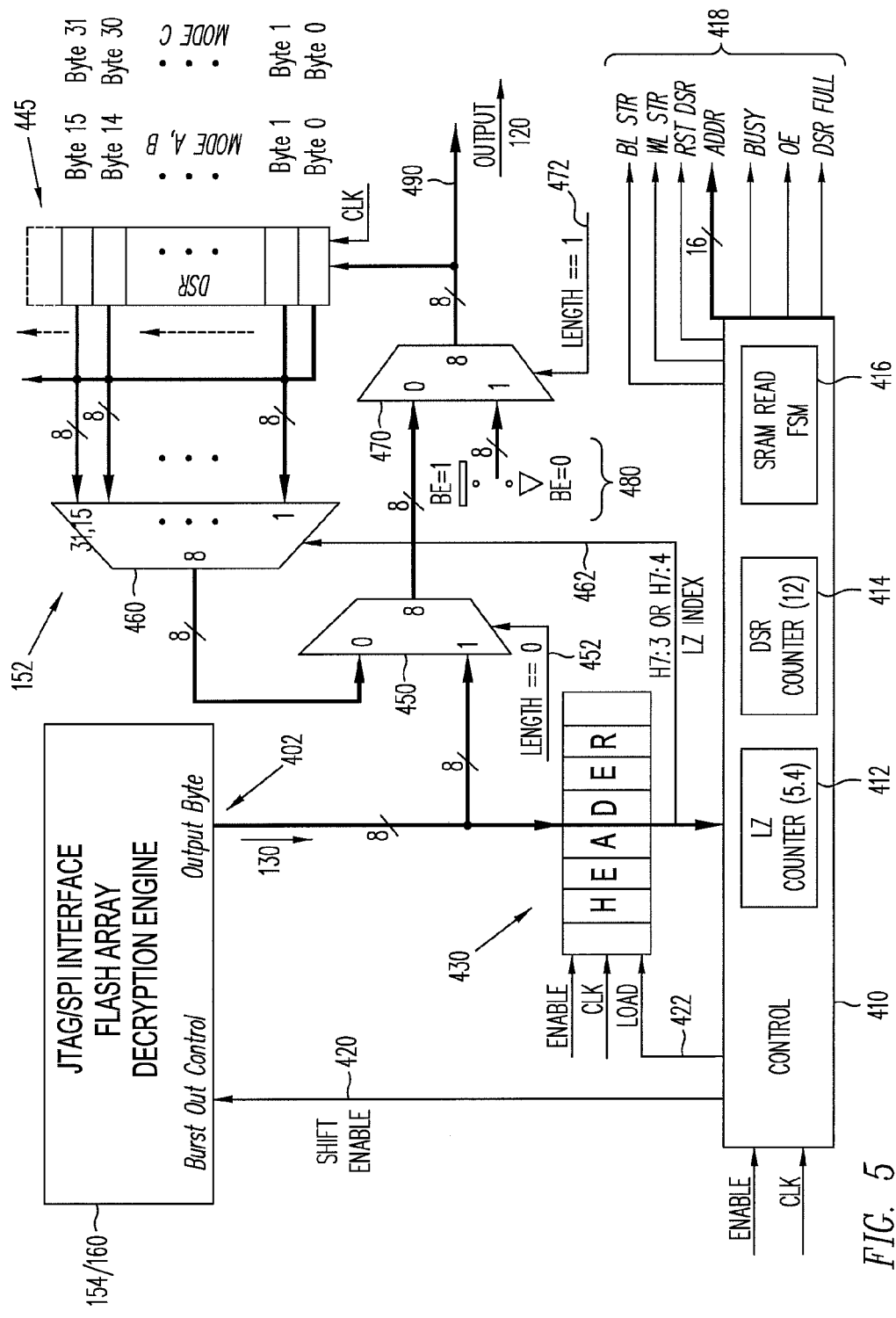

FIG. 5 illustrates another embodiment of decompression engine 152. It will be appreciated that the embodiment shown in FIG. 5 substantially tracks the implementation of FIG. 4. However, in FIG. 5, sliding window registers 440 have been implemented by a data shift register (DSR) 445. For example, in one embodiment, DSR 445 may correspond to the DSR previously described in relation to FIG. 4. Because certain PLD designs may already include DSR 445, the use of DSR 445 in decompression engine 152 can reduce the overall footprint and additional circuitry used to implement decompression engine 152. In comparison with the embodiment shown in FIG. 4, the embodiment of decompression engine 152 shown in FIG. 5 may be implemented with a die size area savings of approximately 2.3K to 4.8K um2 where PLD 150 is implemented with a 90 nm manufacturing process.

The placement of multiplexer 470 also differs in the embodiment shown in FIG. 5. In particular, this embodiment permits multiplexer 470 to pass hard coded bulk erase byte 480 into DSR 445 for processing by multiplexers 460 and 450. In this manner, the embodiment of FIG. 5 may be used where one or more of headers 264A-B have been passed into sliding window 118 during step 340 of the data compression process performed by compression engine 112.

Embodiments described above illustrate but do not limit the invention. It should also be understood that numerous modifications and variations are possible in accordance with the principles of the present invention. Accordingly, the scope of the invention is defined only by the following claims.

I claim:

1. A method of converting uncompressed configuration data into compressed configuration data, wherein the uncompressed configuration data comprises a plurality of rows, the method comprising:
    encoding a row of configuration data comprising only bulk erase bytes into a first bit pattern within a fixed length header;
    encoding a number of continuous bulk erase bytes of configuration data in a row that includes more than bulk erase bytes into a second bit pattern within the fixed length header; and
    encoding at least a portion of a row of configuration data according to a Lempel-Ziv (LZ) compression process into a third bit pattern within the fixed length header.

2. The method of claim 1, wherein the second bit pattern identifies the number of continuous bulk erase bytes.

3. The method of claim 1, wherein encoding a row of configuration data comprising only bulk erase bytes includes following the fixed length header with a corresponding bit code indicating the contents of the row, the method further including:

encoding a row of configuration data matching a previous row into the first bit pattern within the fixed length header followed by an address of the previous row, wherein the range of possible addresses of a previous row does not include the corresponding bit code.

4. A computer readable medium on which is stored a computer program for performing the method of claim 1.

5. The method of claim 1, wherein the uncompressed configuration data comprises a bitstream adapted to be loaded into a configuration memory of a programmable logic device (PLD), and wherein each row of the uncompressed configuration data is associated with a corresponding row of the configuration memory of the PLD.

6. The method of claim 1, wherein the LZ compression process comprises:

passing at least a portion of the uncompressed configuration data into a lookahead buffer and a portion of the compressed configuration data into a sliding window;

comparing the lookahead buffer with the sliding window;

identifying a match between the lookahead buffer and the sliding window;

encoding the match in the third bit pattern as an index-length pair to identify the match; and encoding a number of continuous literal bytes into a fourth bit pattern within the fixed length header identifying the number of continuous literal bytes followed by the continuous literal bytes.

7. The method of claim 6, further comprising passing the fixed length header comprising the fourth bit pattern into the sliding window.

8. A method of converting uncompressed configuration data into compressed configuration data, wherein the uncompressed configuration data comprises a plurality of rows, the method comprising:

encoding a row of configuration data comprising only bulk erase bytes into a first bit pattern within a fixed length header followed by a corresponding bit code indicating the contents of the row;

encoding a row of configuration data matching a previous row into the first bit pattern within the fixed length header followed by an address of the previous row; and encoding a number of continuous bulk erase bytes of configuration data in a row that includes more than bulk erase bytes into a second bit pattern within the fixed length header, wherein the range of possible addresses of a previous row does not include the corresponding bit code.

9. The method of claim 8, further comprising encoding at least a portion of a row of configuration data according to a Lempel-Ziv (LZ) compression process into a third bit pattern within the fixed length header.

10. The method of claim 9, wherein the LZ compression process comprises:

passing at least a portion of the uncompressed configuration data into a lookahead buffer and a portion of the compressed configuration data into a sliding window;

comparing the lookahead buffer with the sliding window;

identifying a match between the lookahead buffer and the sliding window;

encoding the match in the third bit pattern as an index-length pair to identify the match; and encoding a number of continuous literal bytes into a fourth bit pattern within the fixed length header identifying the number of continuous literal bytes followed by the continuous literal bytes.

11. The method of claim 10, further comprising passing the fixed length header comprising the fourth bit pattern into the sliding window.

12. The method of claim 8, wherein the second bit pattern identifies the number of continuous bulk erase bytes.

13. A computer readable medium on which is stored a computer program for performing the method of claim 8.

14. The method of claim 8, wherein the uncompressed configuration data comprises a bitstream adapted to be loaded into a configuration memory of a programmable logic device (PLD), and wherein each row of the uncompressed configuration data is associated with a corresponding row of the configuration memory of the PLD.

15. A programmable logic device (PLD) comprising:

a plurality of programmable logic blocks;

a configuration memory adapted to store uncompressed configuration data to determine user-defined functionality of the programmable logic blocks; and a decompression engine adapted to convert compressed configuration data into the uncompressed configuration data for storage in the configuration memory, the decompression engine comprising:

an input port adapted to receive the compressed configuration data, a control block adapted to provide a first control signal and a second control signal, a plurality of header registers adapted to store a fixed length header encoded in the compressed configuration data, a plurality of sliding window registers adapted to store a plurality of data bytes in a plurality of slots, a first multiplexer adapted to pass a byte from a selected one of the slots of the sliding window registers in response to the fixed length header stored in the header registers, a second multiplexer adapted to selectively pass the byte passed by the first multiplexer or pass a byte received from the input port in response to the first control signal, and a third multiplexer adapted to selectively pass the byte passed by the second multiplexer or pass a bulk erase byte in response to the second control signal.

16. The PLD of claim 15, wherein the fixed length header comprises at least one of the following:

a first bit pattern to encode a row that comprises only bulk erase bytes or that matches a previous row;

a second bit pattern to encode a number of continuous bulk erase bytes of configuration data in a row that includes more than bulk erase bytes; or a third bit pattern to encode at least a portion of a row according to a Lempel-Ziv (LZ) compression process.

17. The PLD of claim 16, wherein the compressed configuration data comprises at least one of the following:

a corresponding bit code following the first bit pattern indicating the contents of the row if the row comprises only bulk erase bytes; or an address of a previous row following the first bit pattern if the row matches the previous row, wherein the range of possible addresses of the previous row does not include the corresponding bit code.

18. The PLD of claim 15, wherein the sliding window registers are implemented by a data shift register (DSR) of the PLD.

19. The PLD of claim 15, wherein at least one of the sliding window registers is adapted to receive the byte passed by the second multiplexer.

20. The PLD of claim 15, wherein at least one of the sliding window registers is adapted to receive the byte passed by the third multiplexer.

* * * * *